(12) United States Patent
Yum et al.

(10) Patent No.: US 10,950,754 B2
(45) Date of Patent: Mar. 16, 2021

(54) SEMICONDUCTOR DEVICE INCREASING LIGHT OUTPUT

(71) Applicant: LG INNOTEK CO., LTD., Seoul (KR)

(72) Inventors: Woong Sun Yum, Seoul (KR); Hyun Ju Kim, Seoul (KR); Jin Soo Park, Seoul (KR); Seung Il Lee, Seoul (KR); Jae Young Im, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 50 days.

(21) Appl. No.: 16/474,197

(22) PCT Filed: Dec. 27, 2017

(86) PCT No.: PCT/KR2017/015519
§ 371 (c)(1),
(2) Date: Jun. 27, 2019

(87) PCT Pub. No.: WO2018/124715
PCT Pub. Date: Jul. 5, 2018

(65) Prior Publication Data
US 2019/0355875 A1 Nov. 21, 2019

(30) Foreign Application Priority Data
Dec. 29, 2016 (KR) .......................... 10-2016-0181985

(51) Int. Cl.
*H01L 33/38* (2010.01)
*H01L 33/30* (2010.01)
*H01L 33/40* (2010.01)

(52) U.S. Cl.
CPC .............. *H01L 33/38* (2013.01); *H01L 33/30* (2013.01); *H01L 33/405* (2013.01)

(58) Field of Classification Search
CPC ........ H01L 33/38; H01L 33/30; H01L 33/405
See application file for complete search history.

(56) References Cited

U.S. PATENT DOCUMENTS 7,956,376 B2 * 6/2011 Jeong ...................... H01L 33/42
257/98
8,173,469 B2 * 5/2012 Park ..................... H01L 33/0093
438/47

(Continued)

FOREIGN PATENT DOCUMENTS

KR 10-2006-0095690 9/2006
KR 10-2011-0083256 7/2011

(Continued)

OTHER PUBLICATIONS

International Search Report dated Apr. 5, 2018 issued in Application No. PCT/KR2017/015519.

*Primary Examiner* — Lex H Malsawma
(74) *Attorney, Agent, or Firm* — KED & Associates LLP

(57) ABSTRACT

An embodiment discloses a semiconductor device comprising: a light-emitting structure having a first conductive semiconductor layer, a second conductive semiconductor layer and an active layer disposed between the first conductive semiconductor layer and the second conductive semiconductor layer; a first electrode disposed on the first conductive semiconductor layer; a second electrode disposed below the second conductive semiconductor layer; and a current blocking layer disposed between the second conductive semiconductor layer and the second electrode, wherein the first conductive semiconductor layer includes a first region in which the first electrode is disposed and a second region, the thickness of which is less than the thickness of the first region, and the current blocking layer is disposed in a region corresponding to the first region in the thickness direction.

16 Claims, 5 Drawing Sheets

(56) References Cited

U.S. PATENT DOCUMENTS

| | | | |
|---|---|---|---|
| 8,466,480 B2* | 6/2013 | Cho | ............... H01L 33/405 |
| | | | 257/98 |
| 8,536,557 B2* | 9/2013 | Moon | ............... H01L 33/06 |
| | | | 257/4 |
| 8,748,865 B2* | 6/2014 | Won | ............... H01L 33/06 |
| | | | 257/13 |
| 2006/0202227 A1 | 9/2006 | Kim et al. | |
| 2011/0084298 A1* | 4/2011 | Lai | ............... H01L 33/145 |
| | | | 257/98 |
| 2011/0163346 A1 | 7/2011 | Seo et al. | |
| 2012/0273753 A1* | 11/2012 | Tanaka | ............... H01L 33/38 |
| | | | 257/13 |
| 2012/0292653 A1 | 11/2012 | Lee | |

FOREIGN PATENT DOCUMENTS

| | | |
|---|---|---|
| KR | 10-2015-0078088 | 7/2015 |
| KR | 10-1668629 | 10/2016 |

* cited by examiner

[FIG. 1]
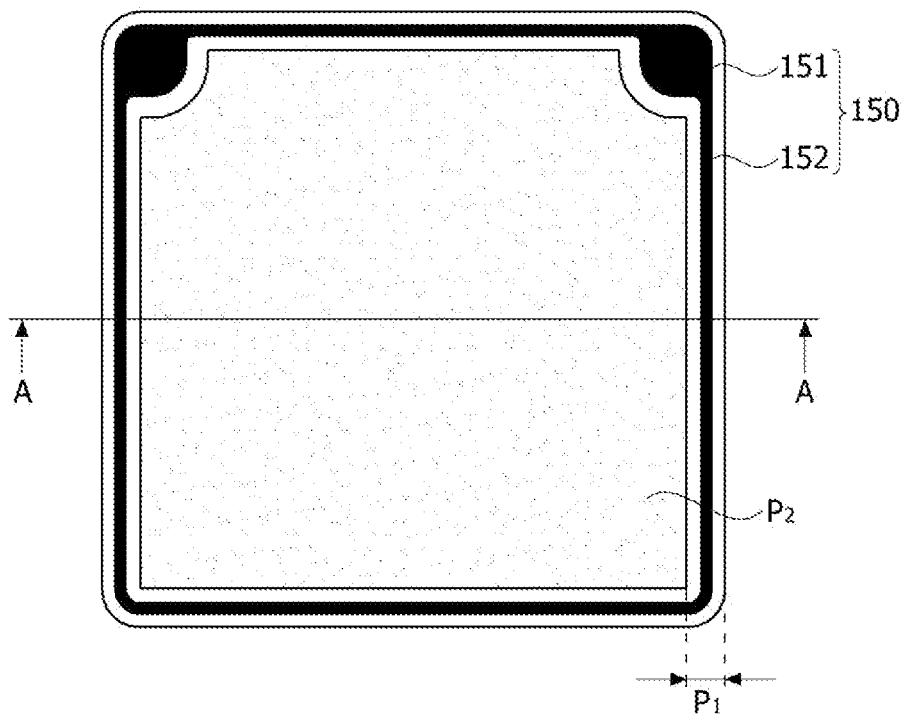
[FIG. 2]
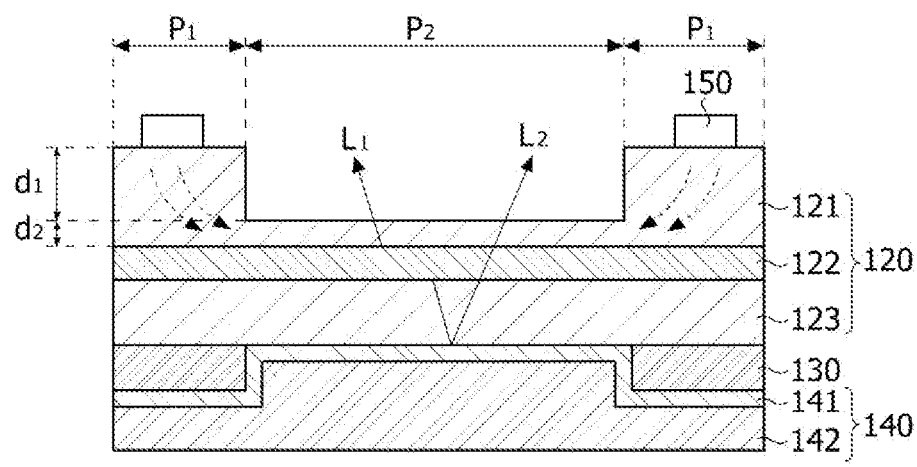

[FIG. 3]
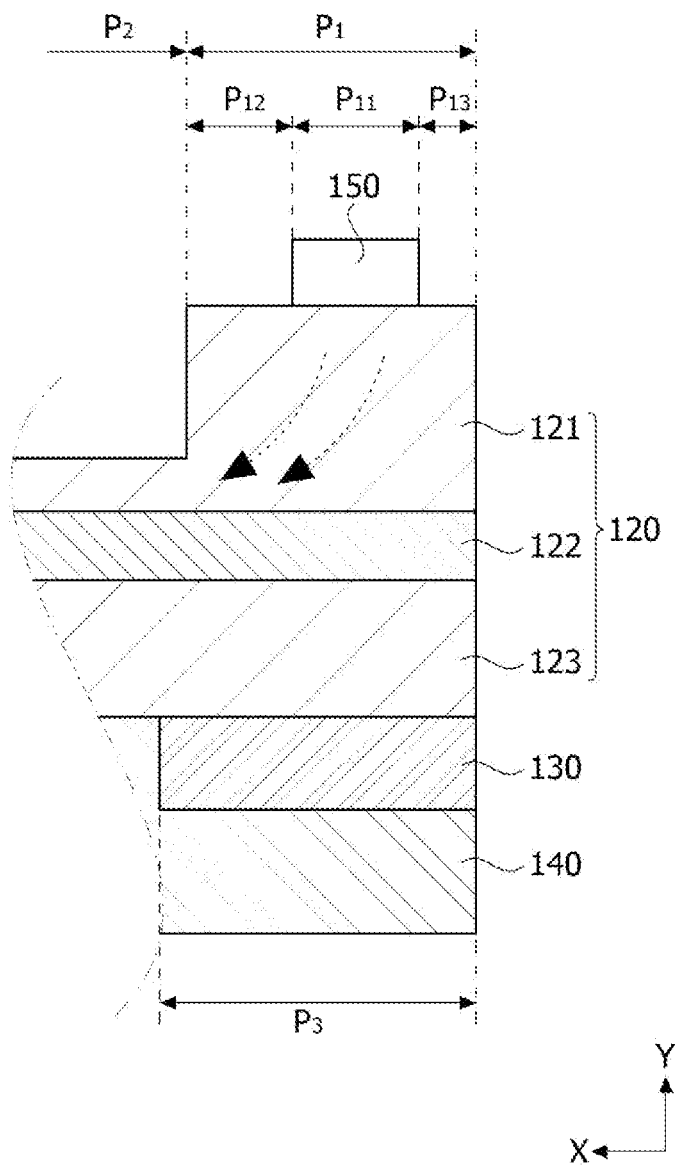

[FIG. 4]
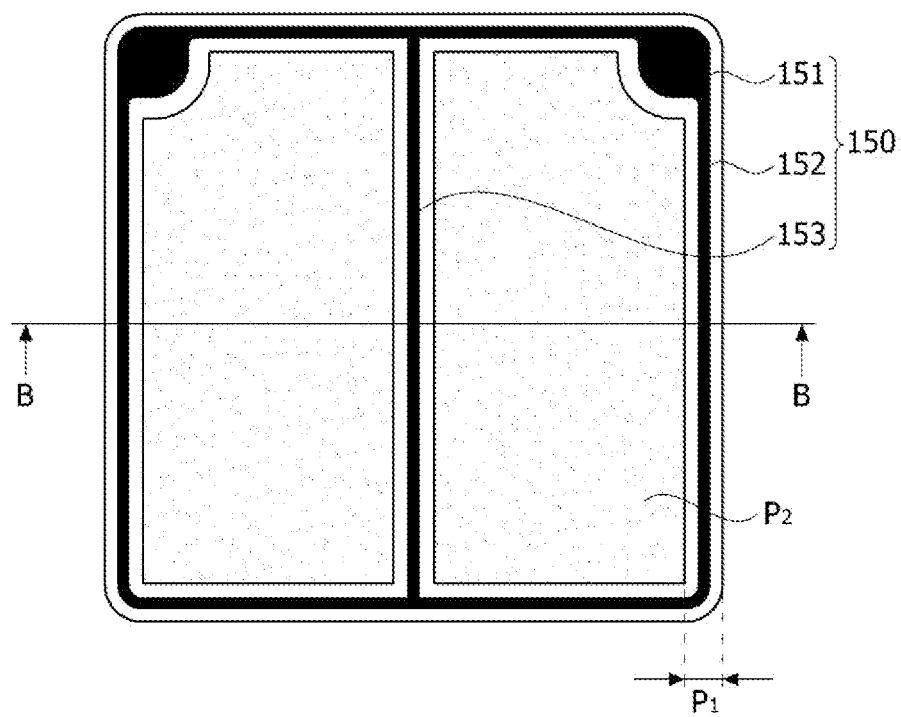
[FIG. 5]
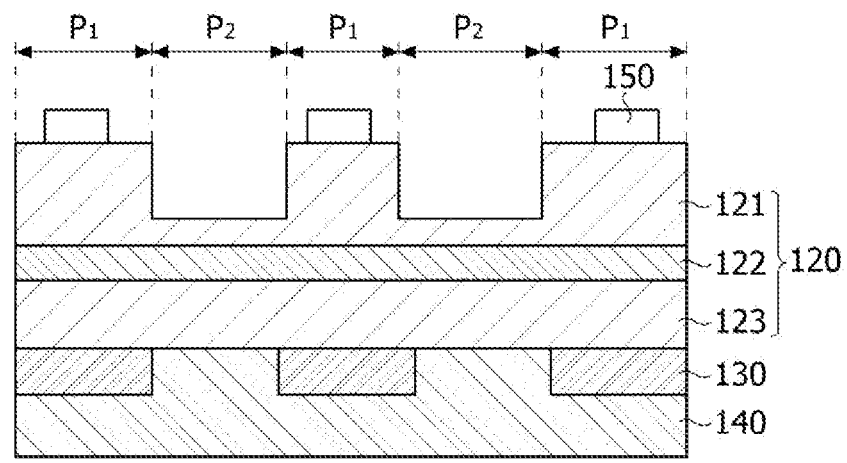

[FIG. 6]
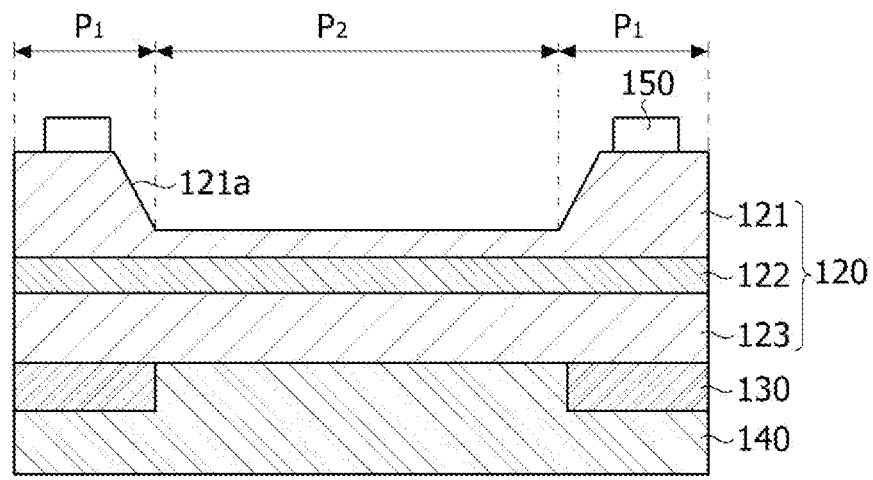
[FIG. 7]
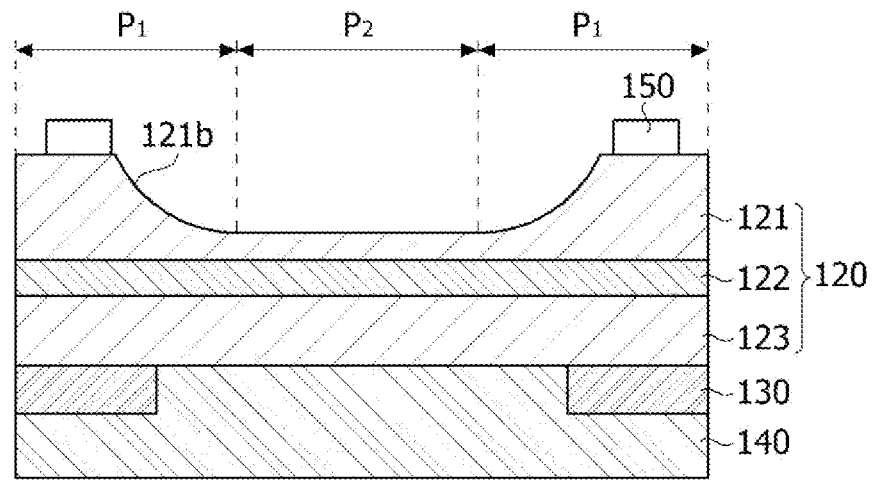

[FIG. 8]
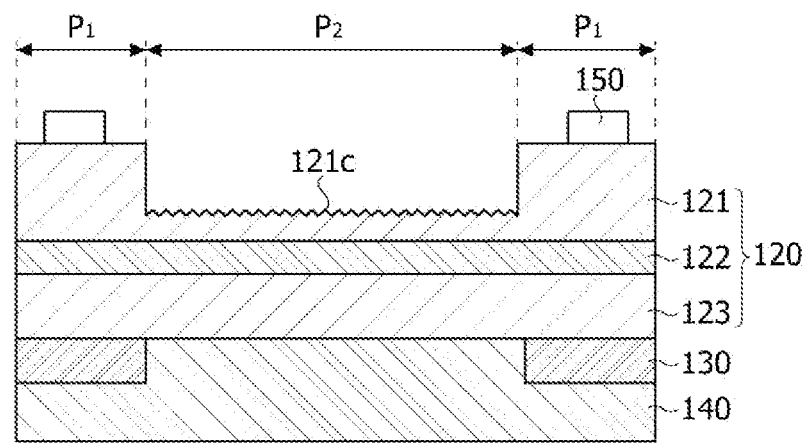
[FIG. 9]
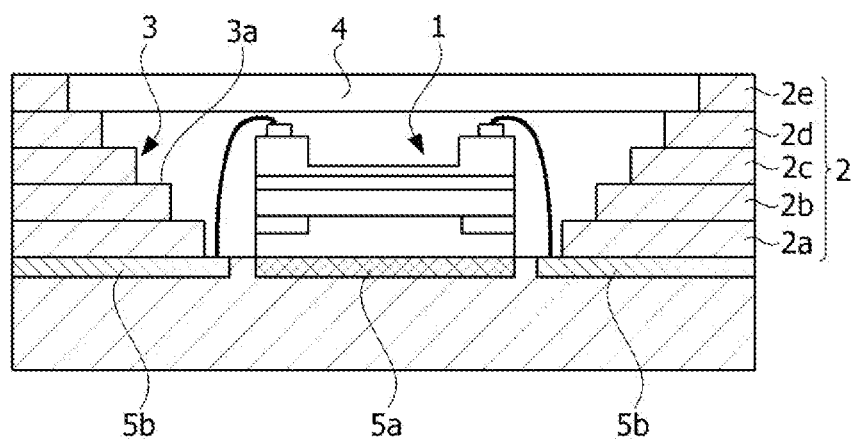

SEMICONDUCTOR DEVICE INCREASING LIGHT OUTPUT

CROSS-REFERENCE TO RELATED PATENT APPLICATIONS

This application is a U.S. National Stage Application under 35 U.S.C. § 371 of PCT Application No. PCT/KR2017/015519, filed Dec. 27, 2017, which claims priority to Korean Patent Application No. 10-2016-0181985, filed Dec. 29, 2016, whose entire disclosures are hereby incorporated by reference.

TECHNICAL FIELD

The present invention relates to a semiconductor device.

BACKGROUND ART

Since semiconductor devices including compounds, such as GaN and AlGaN, have many advantages in that energy band gaps are wide and easy to adjust, the semiconductor devices can be variously used for light-emitting devices, light receiving devices, various diodes, and the like.

Particularly, the light-emitting devices such as light-emitting diodes and laser diodes using III-V or II-VI compound semiconductor materials can express various colors such as red, green, and blue and emit ultraviolet light as thin film growth technologies and device materials are developed, can emit high efficiency white light when phosphors are used or colors are mixed, and have advantages in low power consumption, semi-permanent lifespan, quick response time, safety, and eco-friendliness when compared to conventional light sources such as fluorescent tubes and incandescent lamps.

In addition, when the light receiving devices such as a photodetector or a solar cell are manufactured using III-V or II-VI compound semiconductor materials, since the light receiving devices absorb light in various wavelength ranges to generate a photocurrent due to developed device materials, light in various wavelength ranges from a gamma ray range to a radio frequency range can be used. In addition, the light receiving devices can be easily used for power control, microwave circuits, or communication modules due to their advantages in quick response time, safety, eco-friendliness, and easy adjustment of the device materials.

Therefore, applications of the semiconductor devices are being widened to receiving modules of optical communications, light-emitting diode backlights substituting for cold cathode fluorescence lamps (CCFL) forming backlights of liquid crystal display (LCD) devices, white light-emitting diode lighting devices substituting for fluorescent tubes and incandescent lamps, vehicle head lights, traffic lights, and sensors configured to detect gas or fire. In addition, applications of the semiconductor devices can be widened to high frequency application circuits, other power control apparatuses, and communication modules.

Particularly, the light-emitting device emitting light of an ultraviolet wavelength band can perform a curing or sterilizing action and can be used for curing, medical, and sterilizing purposes.

Recently, studies for ultraviolet light emitting devices have been actively carried out, but there is a problem in that the ultraviolet light emitting device is difficult to form as a flip chip.

DISCLOSURE

Technical Problem

The present invention is directed to providing a light-emitting device whose output is increased.

The present invention is also directed to providing a vertical type ultraviolet light-emitting device.

Objectives to be solved by embodiments are not limited to the above-described objectives and will include objectives and effects which can be identified by solutions for the objectives and the embodiments described below.

Technical Solution

One aspect of the present invention provides a semiconductor device including: a light-emitting structure including a first conductive semiconductor layer, a second conductive semiconductor layer, and an active layer disposed between the first conductive semiconductor layer and the second conductive semiconductor layer; a first electrode disposed on the first conductive semiconductor layer; a second electrode disposed under the second conductive semiconductor layer; and a current blocking layer disposed between the second conductive semiconductor layer and the second electrode, wherein the first conductive semiconductor layer includes a first region in which the first electrode is disposed, and a second region having a thickness less than that of the first region, and the current blocking layer is disposed in a region corresponding to the first region in a thickness direction thereof.

A thickness ratio between the first region and the second region may range from 1:0.2 to 1:0.7.

A ratio between a total area of the first conductive semiconductor layer and an area of the second region may range from 1:0.5 to 1:0.9.

The first region may be disposed at an edge of the first conductive semiconductor layer, and the second region may be disposed at a center of the first conductive semiconductor layer.

The first electrode may include at least one pad disposed at a corner of the first conductive semiconductor layer and a branch electrode extending from the pad.

The branch electrode may include a first branch electrode disposed at the edge of the first conductive semiconductor layer and at least one second branch electrode extending from the first branch electrode.

The first region may include a first subregion in which the first electrode is disposed, a second subregion disposed between the second region and the first subregion, and a third subregion disposed outside the first subregion.

The second subregion may include an inclined surface.

The second electrode may include a reflective layer which reflects light in an ultraviolet wavelength band.

The current blocking layer may be disposed at a position corresponding to the first region in the thickness direction.

A width of the current blocking layer in a first direction may be greater than that of the first electrode in the first direction width, and the first direction may be perpendicular to the thickness direction.

The second region may be a region through which light generated in the active layer is emitted to an outside.

The active layer may generate light in an ultraviolet wavelength band.

The first conductive semiconductor layer, the active layer, and the second conductive semiconductor layer may include aluminum.

Advantageous Effects

According to the embodiment, light output can be increased.

Various useful advantages and effects of the present invention are not limited to the above-described advantages, and can be easily understood in a process in which specific embodiments are described.

DESCRIPTION OF DRAWINGS

FIG. 1 is a plan view illustrating a semiconductor device according to one embodiment of the present invention.

FIG. 2 is a cross-sectional view taken along line A-A of FIG. 1.

FIG. 3 is a partially enlarged view of FIG. 2.

FIG. 4 is a plan view illustrating a semiconductor device according to another embodiment of the present invention.

FIG. 5 is a cross-sectional view taken along line B-B of FIG. 4.

FIG. 6 is a view illustrating a first modified embodiment of FIG. 2.

FIG. 7 is a view illustrating a second modified embodiment of FIG. 2.

FIG. 8 is a view illustrating a third modified embodiment of FIG. 2.

FIG. 9 is a conceptual view illustrating a semiconductor element package according to one embodiment of the present invention.

MODES OF THE INVENTION

Embodiments of the present invention may be modified into different forms or the plurality of embodiments may be combined, and the scope of the present invention is not limited to the embodiments which will be described below.

Although a description given in a specific embodiment is not given in other embodiments, the description may be understood to be descriptions of other embodiments as long as there are no opposite or inconsistent descriptions given.

For example, when a feature of an element A is described in a specific embodiment and a feature of an element B is described in another embodiment, the scope of the present invention includes an embodiment in which the elements A and B are combined even when the embodiment is not clearly described as long as there are no opposite or inconsistent descriptions given.

In a description of the embodiment, in a case in which any one element is described as being formed on or under another element, such a description includes both a case in which the two elements are formed to be in direct contact with each other and a case in which the two elements are in indirect contact with each other such that one or more other elements are interposed between the two elements. In addition, in a case in which one element is described as being formed on or under the other element, such a description may include a case in which one element is formed at an upper side or a lower side with respect to another element.

Hereinafter, embodiments of the present invention will be described in detail with reference to the accompanying drawings so that those skilled in the art may easily perform the present invention.

A light-emitting structure according to an embodiment of the present invention may emit light in an ultraviolet wavelength band. For example, a light-emitting structure may also emit light in a near ultraviolet wavelength band (UV-A), light in a far ultraviolet wavelength band (UV-B), or light in a deep ultraviolet wavelength band (UV-C). A wavelength range may be determined by a composition ratio of Al in the light-emitting structure.

For example, the light in the UV-A may have a peak wavelength ranging from 320 nm to 420 nm, the light in the UV-B may have a peak wavelength ranging from 280 nm to 320 nm, and the light in the UV-C may have a peak wavelength ranging from 100 nm to 280 nm.

FIG. 1 is a plan view illustrating a semiconductor device according to one embodiment of the present invention, and FIG. 2 is a cross-sectional view taken along line A-A of FIG. 1.

Referring to FIGS. 1 and 2, a semiconductor device according to the embodiment includes a light-emitting structure 120 including a first conductive semiconductor layer 121, a second conductive semiconductor layer 123, and an active layer 122 disposed between the first conductive semiconductor layer 121 and the second conductive semiconductor layer 123, and first electrodes 150.

The first conductive semiconductor layer 121 may be formed of a III-V or II-VI compound semiconductor or the like and may be doped with a first dopant. The first conductive semiconductor layer 121 may be selected from among semiconductor materials having a composition formula of $In_{x1}Al_{y1}Ga_{1-x1-y1}N$ ($0 \leq x1 \leq 1$, $0 \leq y1 \leq 1$, $0 \leq x1+y1 \leq 1$), for example, GaN, AlGaN, InGaN, and InAlGaN. In addition, the first dopant may be an N-type dopant such as Si, Ge, Sn, Se, and Te. In a case in which the first dopant is the N-type dopant, the first conductive semiconductor layer 121 doped with the first dopant may be an N-type semiconductor layer.

The active layer 122 may be disposed between the first conductive semiconductor layer 121 and the second conductive semiconductor layer 123. The active layer 122 is a layer in which electrons (or holes) injected through the first conductive semiconductor layer 121 meet holes (or electrons) injected through the second conductive semiconductor layer 123. As the electrons and the holes are recombined and transit to a low energy level, the active layer 122 may generate light in an ultraviolet wavelength.

The active layer 122 may have one structure among a single well structure, a multi well structure, a single quantum well structure, a multi quantum well (MQW) structure, a quantum dot structure, and a quantum line structure, but the structure of the active layer 122 is not limited thereto.

The second conductive semiconductor layer 123 is formed on the active layer 122 and may be formed of a III-V or II-VI compound semiconductor, and the second conductive semiconductor layer 123 may be doped with a second dopant. The second conductive semiconductor layer 123 may be formed of a semiconductor material having a composition formula of $In_{x5}Al_{y2}Ga_{1-x5-y2}N$ ($0 \leq x5 \leq 1$, $0 \leq y2 \leq 1$, $0 \leq x5+y2 \leq 1$) or a material selected from among AlInN, AlGaAs, GaP, GaAs, GaAsP, and AlGaInP. In a case in which the second dopant is a P-type dopant such as Mg, Zn, Ca, Sr, and Ba, the second conductive semiconductor layer 123 doped with the second dopant may be a P-type semiconductor layer.

A blocking layer (not shown) may be disposed between the active layer 122 and the second conductive semiconductor layer 123. The blocking layer may prevent the flow of a first carrier (for example, an electron), which is supplied from the first conductive semiconductor layer 121 and discharged to the second conductive semiconductor layer 123, to increase a probability of recombination of the electrons and holes in the active layer 122. An energy band gap of the blocking layer may be greater than those of the active layer 122 and/or the second conductive semiconductor layer 123.

The first conductive semiconductor layer 121 includes first regions P1 in which the first electrodes 150 are disposed, and a second region P2 of which a thickness is thinner than that of the first region P1. The first regions P1 may be edges of the first conductive semiconductor layer 121, and the second region P2 may be a central portion thereof, but the present invention is not necessarily limited thereto. The first regions P1 may be defined as regions in which the first electrodes 150 are disposed, and the second region P2 may be defined as a region from which light generated from the active layer 122 is emitted.

A proportion of aluminum in at least one section of the first conductive semiconductor layer 121 may be less than that in a well layer disposed in the active layer 122. In this case, light L1 emitted from the active layer 122 may be absorbed by the first conductive semiconductor layer 121 so that light output may be decreased. Accordingly, in the embodiment, the first conductive semiconductor layer 121 may be etched to have a thin thickness to increase light extraction efficiency.

The second region P2 may have a thickness d2 ranging from 1 μm to 3 μm. In a case in which the thickness of the second region P2 is greater than 1 μm, current injection efficiency at the second region P2 may be increased, and in a case in which the thickness is less than 3 μm, an amount of light absorption is decreased, and thus light output may be increased.

A proportion of aluminum in at least one section in the second region P2 may be lower than that in a well layer. A proportion of aluminum in the second region P2 is greater than or equal to 80% of the proportion of aluminum in the well layer, but is not limited thereto.

The first region P1 may have a thickness d1 ranging from 1.5 μm to 10 μm. In a case in which the thickness of the first region P1 is greater than 1.5 μm, a current injected into the light-emitting structure 120 through the first electrode 150 may be sufficiently and smoothly dispersed, and in a case in which the thickness is less than 10 μm, since a reabsorption probability for light in the light-emitting structure 120 is decreased, light extraction efficiency may be increased, and thus a flux of light of the semiconductor device may be increased.

A thickness ratio d1:d2 between the first region P1 and the second region P2 may range from 1:0.2 to 1:0.7. In a case in which the thickness ratio is greater than 1:0.2, current injection efficiency at the second region P2 may be increased, and in a case in which the thickness ratio is less than 1:0.7, an absorption amount of light in the second region P2 is decreased, and thus light output may be increased.

According to the embodiment, since the thickness ratio between the first region P1 and the second region P2 satisfies 1:0.2 to 1:0.7, the first region P1 may be thicker to disperse a current, and the second region P2 may be thinner to emit almost all the light generated by the active layer 122.

An area ratio between an overall area of the first conductive semiconductor layer 121 and an area of the second region P2 may range from 1:0.5 to 1:0.9. In a case in which the area ratio is greater than 1:0.5, the area of the second region P2 is increased, and thus light output may be increased, and in a case in which the area ratio is less than 1:0.9, an area of the first region P1 is secured, and thus current injection efficiency may be increased.

The following Table 1 is a table showing an operating voltage and light output which are measured while a width of the first region P1 is gradually increased. When Experimental Example 1 was performed, the second region P2 was formed to have a thickness of 1 μm, and when Experimental Example 9 was performed, the second region P2 was formed to have a thickness of 2 μm. When Experimental Example 2 was performed, the first region P1 was formed to have a width which was the same as that of a current blocking layer 130. When each of Experimental Examples 3 to 8 was performed, the first region P1 was formed to have a width which was increased by 10 μm sequentially from the width in Experimental Example 2. Here, the width may be a distance in a direction perpendicular to a thickness direction. Accordingly, in Experimental Example 2, the width of the first region P1 may be 10 μm greater than that of the current blocking layer 130, and in Experimental Example 3, the width of the first region P1 may be 20 μm greater than that of the current blocking layer 130.

TABLE 1

|  | operating voltage (Vf) | light output (Po) |
| --- | --- | --- |
| Experimental Example 1 | Ref | 100.0% |
| Experimental Example 2 | −0.02 | 101.6% |
| Experimental Example 3 | −0.02 | 97.4% |
| Experimental Example 4 | −0.03 | 98.0% |
| Experimental Example 5 | −0.03 | 98.6% |
| Experimental Example 6 | −0.03 | 96.9% |
| Experimental Example 7 | −0.03 | 94.7% |
| Experimental Example 8 | −0.03 | 93.0% |
| Experimental Example 9 | −0.04 | 72.6% |

From the experimental results, it can be seen that an operating voltage in Experimental Example 9 is decreased by 0.04 V when compared to Experimental Example 1, but light output is decreased to 72.6%. Accordingly, it can be seen that as the area of the second region P2 is increased, light absorption is increased. In addition, referring to Experimental Examples 2 to 8, it can be seen that, as the width of the first region P1 is increased, light output is decreased. That is, it can be seen that, as the area of the second region P2 is decreased, light output is decreased.

Referring to FIG. 2, a second electrode 140 may be disposed under the second conductive semiconductor layer 123. The second electrode 140 may inject a current into the second conductive semiconductor layer 123. In addition, the second electrode 140 may reflect light emitted from the active layer 122.

The second electrode 140 may include a transparent electrode layer 141 and a reflective layer 142.

The transparent electrode layer 141 may serve as an ohmic electrode. The transparent electrode layer 141 may be formed to include at least one among indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO Nitride (IZON), Al—Ga ZnO (AGZO), In—Ga ZnO (IGZO), ZnO, IrOx, RuOx, NiO, RuOx/ITO, and Ni/IrOx/Au, or Ni/IrOx/Au/ITO, Ag, Ni, Cr, Ti, Al, Rh, Pd, Ir, Sn, In, Ru, Mg, Zn, Pt, Au, and Hf, but is not limited to such a material.

The reflective layer 142 may be formed of a material having a high reflectivity in an ultraviolet wavelength band.

For example, the reflective layer 142 may include aluminum. In a case in which the reflective layer 142 includes aluminum, the reflective layer 142 may serve to reflect light L2 emitted from the active layer 122 in an upward direction to increase light extraction efficiency.

The current blocking layer 130 may block a current injected from the first electrode 150 from flowing in a vertical direction. The current blocking layer 130 may be formed of at least one selected from the group consisting of $SiO_2$, $Si_xO_y$, $Si_3N_4$, $Si_xN_y$, $SiO_xN_y$, $Al_2O_3$, $TiO_2$, AlN, and the like, but is not limited thereto. The current blocking layer 130 may be formed to have a single layer or a plurality of layers. The current blocking layer 130 may have a thickness which is greater than or equal to 0.1 μm, but is not limited thereto.

The first electrode 150 may be disposed in the first region P1. The first electrode 150 may be disposed at an edge of the first conductive semiconductor layer 121 to inject a current.

Referring to FIG. 1, the first electrode 150 may include at least one pad 151 disposed at a corner of the first conductive semiconductor layer 121 and a branch electrode 152 extending from the pad 151. The pad 151 may be connected to an external power source through a wire. The branch electrode 152 may extend along an edge of the first conductive semiconductor layer 121. Accordingly, since a current may be uniformly injected into the first conductive semiconductor layer 121, light output may be increased.

FIG. 3 is a partially enlarged view of FIG. 2.

Referring to FIG. 3, a current injected through the second electrode 140 may curve and flow toward a center of the active layer 122 due to the current blocking layer 130. That is, current dispersion efficiency may be increased due to the thickness of the first region P1 and the current blocking layer 130. Accordingly, it may be advantageous that the current blocking layer 130 is disposed in a region corresponding to the first region P1.

A width P3 of the current blocking layer 130 in a first direction may be greater than that of the first region P1. As the width P3 of the current blocking layer 130 is increased in the first direction, a current may curve more and flow toward the central portion of the active layer 122. Here, the first direction (X-axis direction) may be a direction perpendicular to a thickness direction (Y-axis direction) of the light-emitting structure 120.

A ratio between the width of the first region P1 and the width P3 of the current blocking layer 130 may range from 1:1 to 1:3. In a case in which a width ratio P1:P3 is less than 1:1, some of an injected current may flow in the thickness direction to decrease light output. In addition, in a case in which the width ratio P1:P3 is greater than 1:3, an area of the reflective layer of the second electrode 140 is decreased, and thus light extraction efficiency may be decreased.

The first region P1 may include a first subregion P11 in which the first electrode 150 is disposed, a second subregion P12 disposed between the second region P2 and the first subregion P11, and a third subregion P13 disposed outside the first subregion P11. The second subregion P12 and the third subregion P13 may be designed by considering tolerances.

For example, a width of the second subregion P12 and a width of the third subregion P13 may range from 1 μm to 20 μm in the first direction. In a case in which the width is less than 1 μm, when a tolerance occurs, the first electrode 150 is not disposed in the first region P1, and thus there is a problem of decreasing yield, and in a case in which the width is greater than 20 μm, an area of the second region P2 is relatively decreased, and thus there is a problem of decreasing light extraction efficiency.

FIG. 4 is a plan view illustrating a semiconductor device according to another embodiment of the present invention, and FIG. 5 is a cross-sectional view taken along line B-B of FIG. 4.

Referring to FIGS. 4 and 5, each first electrode 150 may include first branch electrodes 152 extending from a pad 151 and a second branch electrode 153 which connects the first branch electrodes 152, and a shape of the second branch electrode 153 is not particularly limited. The second branch electrode 153 may divide a second region P2 into a plurality of regions. The second region P2 may be disposed between a plurality of first regions P1. According to such a structure, current dispersion efficiency is increased, and thus light-emitting efficiency can be increased.

The number and a shape of the branch electrodes 153 are not particularly limited. The plurality of second branch electrodes 153 may be horizontally or vertically disposed, and the proper number of second branch electrodes 153 may be disposed for current dispersion.

An area ratio between an overall area of a first conductive semiconductor layer 121 and an area of the second region P2 may range from 1:0.5 to 1:0.9. In a case in which the area ratio is greater than 1:0.5, the area of the second region P2 is increased, and thus light output can be increased, and in a case in which the area ratio is less than 1:0.9, an area of the first region P1 is secured, and thus current injection efficiency can be increased.

FIG. 6 is a view illustrating a first modified embodiment of FIG. 2, FIG. 7 is a view illustrating a second modified embodiment of FIG. 2, and FIG. 8 is a view illustrating a third modified embodiment of FIG. 2.

Referring to FIG. 6, a first region P1 may include an inclined surface 121a at a sidewall adjacent to a second region P2. According to such a structure, an amount of light reflected from a portion between the first region P1 and the second region P2 toward an inside of a light-emitting structure 120 may be decreased, and thus light output can be increased.

In addition, since an area is gradually decreased from the first region P1 to the second region P2, the gradually decreased area may serve to perform a channel to guide an injected current to the second region P2. Accordingly, current dispersion efficiency can be increased. Referring to FIG. 7, an inclined surface 121b may also be concavely formed in a first region P1 toward a second region P2. However, the inclined surface is not necessarily limited thereto, and the inclined surface may also be convexly formed.

Referring to FIG. 8, a light extraction pattern 121c may be formed in a second region P2. The light extraction pattern 121c may increase extraction efficiency for light emitted from a light-emitting structure 120. An average height of the light extraction pattern 121c may be changed according to an ultraviolet wavelength, in the case of UV-C, the height may range from 300 nm to 800 nm, and when the average height ranges from 500 nm to 600 nm, light extraction efficiency may be increased. However, heights of irregularities are not necessarily limited thereto.

FIG. 9 is a conceptual view illustrating a semiconductor element package according to one embodiment of the present invention.

The semiconductor element may be formed as a package and used to cure a resin or resist and spin on dielectric (SOD) or spin on glass (SOG). Alternatively, the semiconductor element may also be used for therapy and medical purposes or to sterilize an air cleaner, a water purifier, and the like.

Referring to FIG. 9, the semiconductor element package may include a body 2 in which a groove 3 is formed, a semiconductor element 1 disposed in the body 2, and a pair of lead frames 5a and 5b disposed in the body 2 and electrically connected to the semiconductor element 1. The semiconductor element 1 may include all of the above-described components.

The body 2 may include a material or a coated layer which reflects ultraviolet light. The body 2 may be formed by stacking a plurality of layers 2a, 2b, 2c, and 2d. The plurality of layers 2a, 2b, 2c, and 2d may be formed of one material or different materials.

The groove 3 is formed to be widened in a direction farther away from the semiconductor element, and a step 3a may be formed on an inclination surface.

A light transmission layer 4 may cover the groove 3. The light transmission layer 4 may be formed of a glass material but is not limited thereto. When a material is capable of effectively transmitting ultraviolet light, the material of the light transmission layer 4 is not particularly limited. An inside of the groove 3 may be an empty space.

The semiconductor element may be used as a light source of a lighting system, a light source of an image display apparatus, or a light source of a lighting device. That is, the semiconductor element may be disposed in a case and applied to various electronic devices which provide light. For example, in a case in which the semiconductor element and red, green, and blue (RGB) phosphors are mixed and used, white light with a high color rendering index (CRI) may be realized.

The above-described semiconductor element is formed as a light-emitting device package and may be used as a light source of a lighting system. For example, the semiconductor element may be used as a light source of an image display apparatus, a light source of a lighting device, and the like.

The semiconductor element may be used as an edge type backlight unit or a direct type backlight unit when used as a backlight unit of the image display apparatus, and the semiconductor element may be used in a lighting apparatus or as a bulb type lighting device when used as the light source of the lighting device. In addition, the semiconductor element may also be used as a light source of a mobile phone.

The light-emitting device includes a laser diode in addition to the above-described light-emitting diode.

The laser diode may include the first conductive semiconductor layer, the active layer, and the second conductive semiconductor layer of the above-described structure like the light-emitting device. In addition, the laser diode uses an electro-luminescence phenomenon in which light is emitted when a P-type first conductive semiconductor and an N-type second conductive semiconductor are bonded to each other and a current is applied thereto, but there are differences in orientation and phase of emitted light. That is, the laser diode may emit light in one specific wavelength (monochromatic beam) and one phase in one direction by using a stimulated emission phenomenon, a constructive interference, and the like and may be used for optical communication, medical equipment, semiconductor process equipment, and the like due to such features.

A photodetector, which is a kind of transducer configured to detect light and convert an intensity thereof to an electrical signal, may be an example of a light-receiving element. Such a photodetector includes a photocell (silicon or selenium), light output pre-element (cadmium sulfide or cadmium selenide), a photodiode (for example, a photodiode having a peak wavelength in a visible blind spectral region or a true blind spectral region), a phototransistor, a photo-multiplier tube, a photo-tube (vacuum or gas-filled), an infra-red (IR) detector, and the like but is not limited thereto.

In addition, the semiconductor element such as the photodetector may generally be manufactured using a direct bandgap semiconductor with a high photoconversion efficiency. Alternatively, the photodetector has various structures, and the most typical photodetector includes a p-type/insulator/n-type (PIN)-type photodetector using a p-n junction, a Schottky-type photodetector using a Schottky junction, a metal/semiconductor/metal (MSM)-type photodetector, and the like.

The photodiode may include the first conductive semiconductor layer, the active layer, and the second conductive semiconductor layer of the above-described structure like the light-emitting device and is formed to have a p-n junction or a PIN structure. The photodiode is operated by applying a reverse bias or a zero bias, and when light is incident on the photodiode, electrons and holes are generated so that a current flows. In this case, an amount of current is almost proportional to an intensity of the light incident on the photodiode.

The photocell or a solar cell is one kind of the photodiode and may include the first conductive semiconductor layer, the active layer, and the second conductive semiconductor layer of the above-described structure like the light-emitting device.

In addition, the semiconductor element may also be used as a rectifier of an electronic circuit through rectification characteristics of a general diode using a p-n junction and may be applied to an oscillation circuit by being applied to an ultrahigh frequency circuit.

In addition, the above-described semiconductor element is not necessarily formed of only a semiconductor and may further include a metal material in some cases. For example, the semiconductor element such as the light-receiving element may be formed of at least one among Ag, Al, Au, In, Ga, N, Zn, Se, P, and As and may also be formed of a semiconductor material doped with a P-type or N-type dopant or an intrinsic semiconductor material.

The embodiments have been particularly described but are only examples and do not limit the present invention. It will be understood by those skilled in the art that various changes and applications that are not illustrated above will be made within a range without departing from the essential characteristics of the present invention. For example, the components specifically described in the embodiments may be changed. In addition, it should be interpreted that differences related to the changes and applications fall within the scope of the present invention defined by the appended claims.

The invention claimed is:

1. A semiconductor device comprising:
   a light-emitting structure including a first conductive semiconductor layer, a second conductive semiconductor layer, and an active layer disposed between the first conductive semiconductor layer and the second conductive semiconductor layer;
   a first electrode disposed on the first conductive semiconductor layer;
   a second electrode disposed on the second conductive semiconductor layer; and
   a current blocking layer disposed between the second conductive semiconductor layer and the second electrode,
   wherein, the first conductive semiconductor layer includes a first region in which the first electrode is disposed, and a second region having a thickness less than that of the first region, and the current blocking layer is disposed in a region corresponding to the first region in a thickness direction thereof, wherein the first region is disposed at an edge of the first conductive semiconductor layer, and the second region is disposed at a center of the first conductive semiconductor layer, and wherein the first electrode includes at least one pad disposed at a corner of the first conductive semiconductor layer and a branch electrode extending from the pad.

2. The semiconductor device of claim 1, wherein a thickness ratio between the first region and the second region ranges from 1:0.2 to 1:0.7.

3. The semiconductor device of claim 1, wherein a ratio between a total area of the first conductive semiconductor layer and an area of the second region ranges from 1:0.5 to 1:0.9.

4. The semiconductor device of claim 1, wherein the branch electrode includes a first branch electrode disposed at the edge of the first conductive semiconductor layer and at least one second branch electrode extending from the first branch electrode.

5. The semiconductor device of claim 1, wherein the first region includes:
a first subregion in which the first electrode is disposed;
a second subregion disposed between the second region and the first subregion; and
a third subregion disposed outside the first subregion.

6. The semiconductor device of claim 5, wherein the second subregion includes an inclined surface.

7. The semiconductor device of claim 1, wherein a thickness of the first region ranges from 1.5 μm to 10 μm.

8. The semiconductor device of claim 1, wherein a thickness of the second region ranges from 1 μm to 3 μm.

9. The semiconductor device of claim 1, wherein:
the current blocking layer is disposed at a position corresponding to the first region in the thickness direction;
a width of the current blocking layer in a first direction is greater than that of the first electrode in the first direction; and
the first direction is perpendicular to the thickness direction.

10. The semiconductor device of claim 1, wherein the second region is a region through which light generated in the active layer is emitted to an outside.

11. The semiconductor device of claim 1, wherein the first conductive semiconductor layer, the active layer, and the second conductive semiconductor layer include aluminum.

12. The semiconductor device of claim 1, wherein the active layer generates light in an ultraviolet wavelength band.

13. A semiconductor device package comprising:
a body; and
a semiconductor device disposed on the body,
wherein the semiconductor device comprising:
a light-emitting structure including a first conductive semiconductor layer, a second conductive semiconductor layer, and an active layer disposed between the first conductive semiconductor layer and the second conductive semiconductor layer;
a first electrode disposed on the first conductive semiconductor layer;
a second electrode disposed on the second conductive semiconductor layer; and
a current blocking layer disposed between the second conductive semiconductor layer and the second electrode,
wherein, the first conductive semiconductor layer includes a first region in which the first electrode is disposed, and a second region having a thickness less than that of the first region, and the current blocking layer is disposed in a region corresponding to the first region in a thickness direction thereof,
wherein the first region is disposed at an edge of the first conductive semiconductor layer; and
the second region is disposed at a center of the first conductive semiconductor layer, and
wherein the first electrode includes at least one pad disposed at a corner of the first conductive semiconductor layer and a branch electrode extending from the pad.

14. The semiconductor device package of claim 13, wherein a thickness ratio between the first region and the second region ranges from 1:0.2 to 1:0.7.

15. The semiconductor device package of claim 13, wherein a ratio between a total area of the first conductive semiconductor layer and an area of the second region ranges from 1:0.5 to 1:0.9.

16. The semiconductor device package of claim 13, wherein the branch electrode includes a first branch electrode disposed at the edge of the first conductive semiconductor layer and at least one second branch electrode extending from the first branch electrode.

* * * * *